US006724785B1

(12) United States Patent
Tucker et al.

(10) Patent No.: US 6,724,785 B1
(45) Date of Patent: *Apr. 20, 2004

(54) TUNABLE FABRY-PEROT FILTERS AND LASERS WITH REDUCED FREQUENCY NOISE

(75) Inventors: Rodney S. Tucker, Hawthron (AU); Wayne V. Sorin, Mountain View, CA (US); Douglas M. Baney, Los Altos, CA (US); Curt A. Flory, Los Altos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/549,267

(22) Filed: Apr. 14, 2000

(51) Int. Cl.[7] .................. H01S 3/10; H01S 3/121; H01S 3/13; H01S 3/00; H01S 3/08; G02B 27/00
(52) U.S. Cl. .............. 372/20; 372/14; 372/29.015; 372/38.07; 372/99; 359/578
(58) Field of Search ............. 372/20, 14, 29.013, 372/29.015, 29.022, 38.05, 38.07, 99; 359/578

(56) References Cited

U.S. PATENT DOCUMENTS

| | | | |
|---|---|---|---|
| 5,022,745 A | | 6/1991 | Zayhowski et al. |
| 5,835,216 A | * | 11/1998 | Koskinen .................. 356/352 |
| 5,909,280 A | | 6/1999 | Zavracky |
| 6,400,738 B1 | * | 6/2002 | Tucker et al. ............... 372/20 |
| 6,438,149 B1 | * | 8/2002 | Tayebati et al. ............ 372/45 |
| 2001/0028503 A1 | * | 10/2001 | Flanders et al. .......... 359/578 |

OTHER PUBLICATIONS

Tran, A.T.T.D et al., "Surface Micromachined Fabry–Perot Tunable Filter", IEEE Photonics Technology Letters, vol. 8, No. 3, Mar. 1996, pp. 393–395.
Jerman, J.H. et al., "A Miniature Fabry–Perot Interferometer with a Corrugated Silicon Diaphragm Support", Sensors and Actuators, vol. 29, No. 2, 1991, pp. 151–158.

* cited by examiner

Primary Examiner—Paul Ip
Assistant Examiner—Armando Rodriguez

(57) ABSTRACT

A tunable optical cavity constructed from a fixed mirror and a movable mirror. The fixed mirror is attached to a substrate having a first electrically conducting surface. A support member having the moveable mirror supported thereon and having a second electrically conducting surface, is suspended above the substrate. A circuit applies an electrical potential between the first and second electrically conducting surfaces thereby adjusting the distance between the fixed and movable mirrors. The fixed mirror and the moveable mirror are positioned such that the mirrors form the opposite ends of the optical cavity. The distance between the fixed mirror and the moveable mirror is a function of the applied electrical potential. The support member has physical dimensions that are chosen such that the amplitude of thermally induced vibrations in the support member are less than 0.01 percent of the wavelength of the resonating light. The support member is preferably a thin film membrane having the moveable mirror attached thereto and having openings communicating between the top and bottom surfaces of the membrane. The openings are located so as to reduce the vibration amplitude of the moveable mirror at any mechanical resonances of the membrane. The openings occupy less than 90% of the surface area of the membrane.

6 Claims, 2 Drawing Sheets

TUNABLE FABRY-PEROT FILTERS AND LASERS WITH REDUCED FREQUENCY NOISE

FIELD OF THE INVENTION

The present invention relates to optical filters, and more particularly, to tunable Fabry-Perot optical resonators, filters and lasers constructed therefrom.

BACKGROUND OF THE INVENTION

Tunable optical resonators are utilized in optical communication systems and in the construction of lasers. Optical filters and lasers based on Fabry-Perot resonators can be constructed using microelectromechanical machining (MEM) techniques, and hence, can, in principle, provide an economically attractive tunable filter or tunable laser. In such devices, a Fabry-Perot resonator cavity is formed between two mirrors. One of these mirrors is flat and located on a semiconductor substrate. The other mirror may be curved and is suspended on a number of micro-mechanical cantilevers. Application of a tuning voltage between the cantilevers and the substrate causes the suspended mirror to move towards the fixed mirror on the substrate, thereby reducing the spacing between the two mirrors of the Fabry-Perot resonator. Since the filter's bandpass frequency is determined by the mirror spacing, a reduction in spacing between the two mirrors causes the resonant optical frequency of the cavity to increase. The shift in the resonant frequency enables the device to be used directly as a tunable bandpass filter. If an optically-pumped or electrically-pumped optical gain medium (active region) is placed in the cavity, the device becomes a tunable laser, with the lasing wavelength controlled by the resonant frequency of the Fabry-Perot cavity.

Prior art MEM Fabry-Perot filters exhibit a significant amount of noise, which limits the usefulness of these devices. The noise results from mechanical vibrations in the mirror connected to the cantilevers. This noise causes variations in the spacing between the mirrors, which in turn, causes the resonant frequency and amplitude of the light emitted from the filter to exhibit a corresponding noise spectrum. The noise broadening of the resonant frequency can double the width of the passband response of a filter and can substantially increase the linewidth of a laser constructed from such a filter, thereby making the filter or laser unsuitable for many applications.

Broadly, it is the object of the present invention to provide an improved MEM Fabry-Perot resonator.

It is a further object of the present invention to provide a MEM Fabry-Perot resonator that has reduced noise.

These and other objects of the present invention will become apparent to those skilled in the art from the following detailed description of the invention and the accompanying drawings.

SUMMARY OF THE INVENTION

The present invention is a tunable optical cavity constructed from a fixed mirror and a movable mirror. The fixed mirror is attached to a substrate having a first electrically conducting surface. A support member having the moveable mirror supported thereon and having a second electrically conducting surface, is suspended above the substrate. A circuit applies an electrical potential between the first and second electrically conducting surfaces thereby adjusting the distance between the fixed and movable mirrors. The fixed mirror and the moveable mirror are positioned such that the mirrors form the opposite ends of the optical cavity. The distance between the fixed mirror and the moveable mirror is a function of the applied electrical potential. The support member has physical dimensions that are chosen such that the amplitude of thermally induced vibrations in the support member are less than 0.01 percent of the wavelength of the resonating light. The support member is preferably a thin film membrane having the moveable mirror attached thereto and having openings communicating between the top and bottom surfaces of the membrane. The openings are located so as to reduce the vibration amplitude of the moveable mirror at any mechanical resonances of the membrane. The openings occupy less than 90% of the surface area of the membrane.

DETAILED DESCRIPTION OF THE INVENTION

Figure 2:
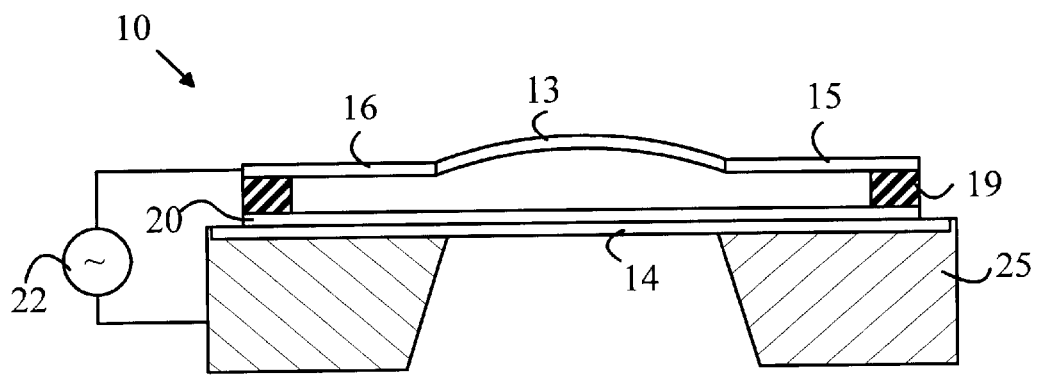
FIG. 2 is a cross-sectional view of the laser shown in FIG. 1 through line 11–12.
Figure 1:
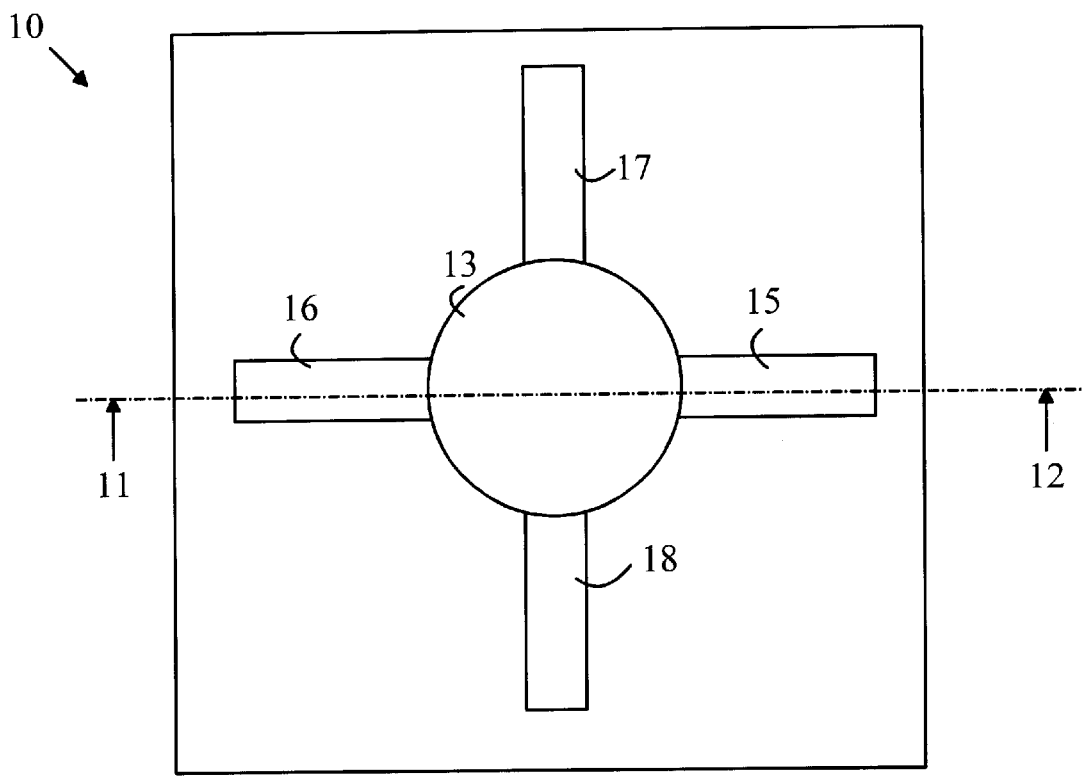
FIG. 1 is a top view of a Fabry-Perot based filter or laser.

The present invention may be more easily understood with reference to FIGS. 1 and 2. FIG. 1 is a top view of a Fabry-Perot based filter or laser. FIG. 2 is a cross-sectional view of the laser shown in FIG. 1 through line 11–12. A Fabry-Perot resonator cavity is formed between mirrors 13 and 14. Mirror 14 is flat and located on a semiconductor substrate 25. The mirror 13 is typically curved and is suspended on a number of micro-mechanical cantilevers shown at 15–18. The mirrors are preferably constructed from a number of layers of transparent material having indices of refraction that alternate from layer to layer. Such mirrors are well known to the art of semiconductor lasers, and hence, will not be discussed in detail here. To simplify the drawing, the layered structure of the mirrors has been omitted.

The application of a tuning voltage via voltage source 22 between the cantilevers and the substrate causes suspended mirror 13 to move towards mirror 14, thereby reducing the spacing between the two mirrors of the Fabry-Perot cavity. Since the resonant frequency of the cavity is determined by the distance between the mirrors, this reduction in spacing between the two mirrors causes the resonant optical frequency of the cavity to increase. The shift in the resonant frequency enables the device to be used directly as a tunable bandpass filter. If an optically-pumped or electrically-pumped optical gain medium 20 is placed in the cavity, the device becomes a tunable laser, with the lasing wavelength controlled by the resonant frequency of the Fabry-Perot cavity.

A key feature of the MEM filter and MEM tunable laser is the relatively small spacing between the two mirrors of the optical cavity. Mirror spacings of a few microns can be utilized with a tuning range of 60 nanometers or more, for an input tuning voltage range of about 30 volts.

As noted above, prior art devices of the type shown in FIGS. 1 and 2 suffer from undesirable frequency noise caused by the thermal energy associated with the mirror and its support structure. In essence, for any fixed input control voltage applied to the device, the center frequency of the filter randomly fluctuates about an average value. Since the filter attenuation function varies with frequency, this fluctuation in the center frequency leads fluctuations in the amplitude of the filtered light. These fluctuations render the filter useless in many applications.

The present invention is based on the observation that the noise mechanism responsible for the frequency fluctuations is thermal noise in the movable mirror and its micromechanical cantilevers. Since the moveable mirror is in thermal equilibrium with the air around the mirror, the mirror vibrates with an amplitude determined by the air temperature and the mechanical properties of the mirror and support. This vibration causes mechanical fluctuations in the position of the movable mirror relative to the other mirror. These mechanical fluctuations, in turn, cause fluctuations in the resonant optical frequency of the Fabry-Perot cavity. The mechanical fluctuations are exacerbated by any mechanical resonance in the moveable mirror and its support cantilevers.

The thermal fluctuations result from the fact that the mirror assembly is in thermal equilibrium with the surrounding environment. The mirror is mounted on the cantilevers which act as springs. The thermal energy causes the mirror to oscillate with a displacement that depends on the spring constants and on the temperature. The mirror assembly must oscillate with a mechanical displacement that is determined by the corresponding equilibrium energy at the ambient temperature. The amplitude of the oscillation can be reduced by increasing the spring constants or reducing the absolute temperature. To obtain a significant decrease in the oscillation amplitude by lowering the temperature would require cooling the filter to the temperature of liquid nitrogen or below, and hence is not practical for many applications.

Accordingly, the present invention relies on increasing the spring constant of the support structure. As the spring constant is increased, the displacement of the mirror corresponding to any given thermal energy is decreased. For a simple cantilevered support arm having a width, W, length L, and thickness, T, the spring constant is proportional to $WT^3/L$. While the spring constant can be most easily increased by increasing the thickness of the arm, it must be remembered that the deflection obtained by applying a voltage, V, between the substrate and the arm is proportional to $V^2WL^3/T^3$. Hence, increasing T will rapidly reduce the tuning range for a given voltage. In general, there is a maximum deflection voltage that can be applied to the device. This voltage is usually determined by the driving circuitry and the voltage breakdown characteristics of the Fabry Perot resonator structure. The maximum deflection determines the maximum range over which the frequency of the filter or laser can be tuned. Hence, increasing the spring constant by increasing the thickness of the support arm is not preferred, since this strategy also reduces the range over which the device can be tuned.

Figure 4:
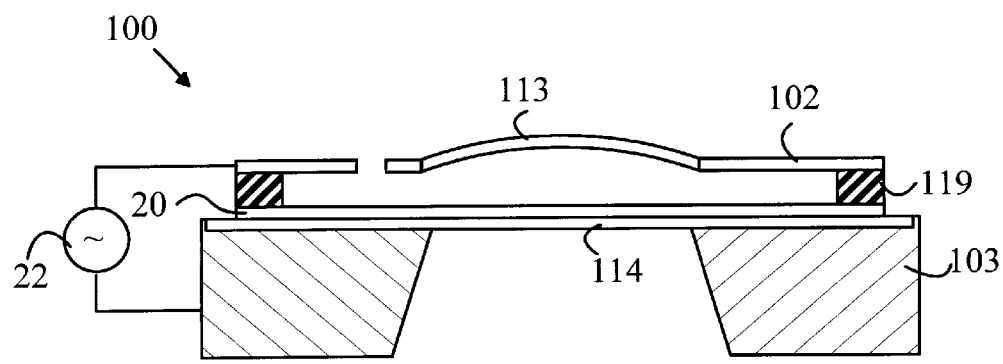
FIG. 4 is a cross-sectional view of filter 100 through line 110–111.
Figure 3:
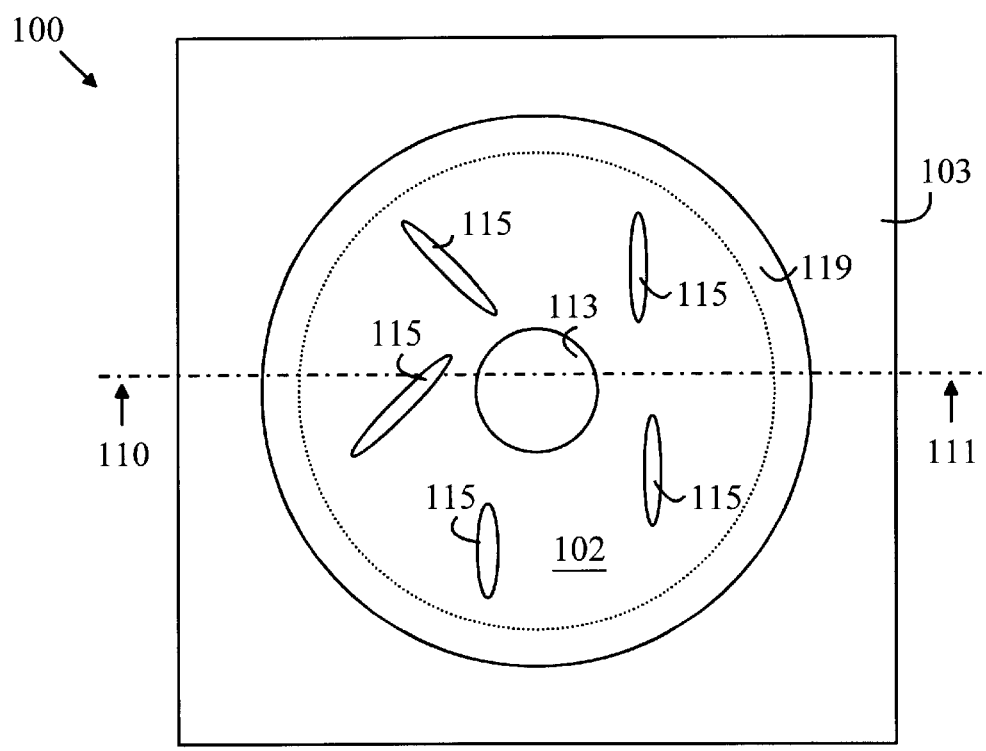
FIG. 3 is a top view of one of the preferred embodiments of a Fabry-Perot filter 100 according to the present invention.

Increasing the spring constant by increasing the width W of the support arm, on the other hand, also increases the tuning range for a given voltage. Therefore, the spring constant can be increased substantially without sacrificing tuning range by increasing W and also by increasing the thickness T by a small amount. Refer now to FIGS. 3–4. FIG. 3 is a top view of one of the preferred embodiments of a Fabry-Perot filter 100 according to the present invention, and FIG. 4 is a cross-sectional view of filter 100 through line 110–111. Filter 100 is based on the observation that the system that provides the "widest" suspension arms is a continuous membrane. In filter 100, the moveable mirror 113 is suspended from a membrane 102 that is suspended from a support 119. The distance between the moveable mirror 113 and the fixed mirror 114 is set by applying a potential between membrane 102 and the substrate 103.

Filter 100 can be constructed utilizing conventional MEM fabrication techniques. The support structure 119 is constructed on the substrate surface. The area that is to become the cavity between the fixed mirror 114 and the membrane is initially filled with a sacrificial layer that can easily be etched away after the support membrane is formed. Phosphorous silicate glass (PSG) is the preferred sacrificial layer. Membrane 102 and mirror 113 are then deposited over the sacrificial layer. The sacrificial layer is then wet-etched through slots 115 in membrane 102.

In designing the support structure, care must be taken to avoid mechanical resonance that can amplify the thermally induced fluctuations in the membrane. Hence, suspension structures with high Q values are to be avoided. In the case of a simple cantilever, damping is affected by the air surrounding the cantilever. Hence, increasing the air damping is also beneficial in that it reduces Q. In the case of the membrane, high-order resonances within the membrane structure should be avoided. In FIG. 3, slots 115 are placed randomly, but symmetrical placement is also possible. Asymmetrical placement of the slots allows air to flow around the membrane, and control the amount of air damping. The slots also reduce high-order resonances. In essence, the single resonance is broken up into a number of smaller resonances at different mechanical vibrational frequencies. The single resonance can also be broken up into multiple resonances by depositing small weights in the form of protrusions on the surface of the membrane in a predetermined pattern.

Various modifications to the present invention will become apparent to those skilled in the art from the foregoing description and accompanying drawings. Accordingly, the present invention is to be limited solely by the scope of the following claims.

What is claimed is:

1. A tunable optical cavity having a resonant wavelength selectable in a range about a predetermined wavelength of light, said cavity comprising:

a fixed mirror attached to a substrate having a first electrically conducting surface;

a support member having a moveable mirror supported thereon, said support member having a second electrically conducting surface, said support member being suspended above said substrate; and a circuit for applying an electrical potential between said first and second electrically conducting surfaces, wherein said fixed mirror and said moveable mirror are positioned such that said mirrors form the opposite ends of said optical cavity and are separated by a distance, wherein said distance between said fixed mirror and said moveable mirror is a function of said applied electrical potential, and also varies because of thermally induced vibrations characterized by a vibration amplitude in said distance, and wherein said amplitude is less than 0.01 percent of said wavelength of light.

2. The optical cavity of claim 1 wherein said support member is a membrane having said moveable mirror attached thereto.

3. A tunable optical cavity having a resonant wavelength selectable in a range about a predetermined wavelength of light, said cavity comprising:

a fixed mirror attached to a substrate having a first electrically conducting surface;

a support member having a moveable mirror supported thereon, said support member having a second electrically conducting surface, said support member being suspended above said substrate; and a circuit for applying an electrical potential between said first and second electrically conducting surfaces, wherein said fixed mirror and said moveable mirror are positioned such that said mirrors form the opposite ends of said optical cavity and are separated by a distance, wherein said distance between said fixed mirror and said moveable mirror is a function of said applied electrical potential, and also varies because of thermally induced vibrations characterized by a vibration amplitude in said distance between said mirrors, and wherein said amplitude is less than 0.01 percent of said wavelength of light, wherein said support member comprises a membrane having said moveable mirror attached thereto, and wherein said membrane comprises a thin film having a top surface and a bottom surface and wherein said membrane has openings communicating between the top and bottom surfaces of said membrane.

4. The optical cavity of claim 3 wherein said openings are located so as to reduce said amplitude at a mechanical resonance of said membrane.

5. The optical cavity of claim 3 wherein said openings occupy less than 90% of the surface area of said membrane.

6. The optical cavity of claim 1 further comprising an active layer for amplifying light trapped in said cavity.

* * * * *